United States Patent
Zhou et al.

(10) Patent No.: US 10,544,778 B2
(45) Date of Patent: Jan. 28, 2020

(54) METHOD OF OPERATING A DFIG WIND TURBINE UNDER SSR

(71) Applicant: VESTAS WIND SYSTEMS A/S, Aarhus N (DK)

(72) Inventors: Yi Zhou, Hefei (CN); Gert Karmisholt Andersen, Hovedgård (DK); Manoj Gupta, Singapore (SG); Vajira Suminda Ganepola, Singapore (SG); Ciprian Biris, Hinnerup (DK); Miguel Angel Cova Acosta, Singpore (SG)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 95 days.

(21) Appl. No.: 15/573,931

(22) PCT Filed: Jun. 16, 2016

(86) PCT No.: PCT/DK2016/050188
§ 371 (c)(1),
(2) Date: Nov. 14, 2017

(87) PCT Pub. No.: WO2017/000946
PCT Pub. Date: Jan. 5, 2017

(65) Prior Publication Data
US 2018/0291876 A1    Oct. 11, 2018

(30) Foreign Application Priority Data
Jun. 29, 2015  (DK) .................................. 2015 70403

(51) Int. Cl.
*F03D 7/02* (2006.01)
*G01R 23/02* (2006.01)
(Continued)

(52) U.S. Cl.
CPC ........... *F03D 7/0264* (2013.01); *F03D 9/257* (2017.02); *G01R 23/02* (2013.01); *G05B 13/024* (2013.01);
(Continued)

(58) Field of Classification Search
CPC ..... F03D 7/0264; F03D 9/257; G05B 13/024; H02K 7/183; H02P 9/006; H02P 9/007;
(Continued)

(56) References Cited

U.S. PATENT DOCUMENTS

| 3,800,236 A | 3/1974 | Riethmuller et al. |
| 4,451,777 A | 5/1984 | Gyugyi |

(Continued)

FOREIGN PATENT DOCUMENTS

| CN | 102753982 A | 10/2012 |
| DE | 3631167 A1 | 3/1988 |

(Continued)

OTHER PUBLICATIONS

SIPO of the People's Republic of China Notification of the First Office Action for Application No. 201680039099.3 dated Oct. 9, 2018.

(Continued)

*Primary Examiner* — Christopher E. Everett
(74) *Attorney, Agent, or Firm* — Patterson + Sheridan, LLP

(57) ABSTRACT

A method is provided of protecting a wind turbine with a doubly-fed induction generator (DFIG) against a sub-synchronous resonance (SSR) event acting on the wind turbine. A plurality of power-output values or current-output values is measured over a given period of time that corresponds to a measurement cycle. It is determined whether power-output values or current-output-values measured in the at-least-one measurement cycle are indicative of an SSR-event critical (Continued)

for further operation of the wind turbine. The wind turbine is shut down if the measured power-output values or current-output values are indeed indicative of an SSR-event critical for operation of the wind turbine.

20 Claims, 11 Drawing Sheets

(51) Int. Cl.
    *F03D 9/25*     (2016.01)
    *G05B 13/02*     (2006.01)
    *H02K 7/18*     (2006.01)
    *H02P 9/00*     (2006.01)
    *G01R 19/25*     (2006.01)

(52) U.S. Cl.
    CPC ............. *H02K 7/183* (2013.01); *H02P 9/006* (2013.01); *F05B 2220/70646* (2013.01); *F05B 2270/107* (2013.01); *F05B 2270/309* (2013.01); *F05B 2270/335* (2013.01); *F05B 2270/337* (2013.01); *G01R 19/2513* (2013.01); *H02P 9/007* (2013.01)

(58) Field of Classification Search
    CPC ...... G01R 19/2513; G01R 23/02; H02H 3/46; H02H 7/067; Y02E 10/725; Y02E 10/723; F05B 2270/309; F05B 2270/107; F05B 2270/337; F05B 2270/335; F05B 2220/70646
    See application file for complete search history.

(56) References Cited

U.S. PATENT DOCUMENTS

| | | | |
|---|---|---|---|
| 4,607,217 A | | 8/1986 | Bhargava |
| 4,757,432 A | * | 7/1988 | Hancock ........... H02M 7/53871 363/17 |
| 2003/0160600 A1 | | 8/2003 | Sahm et al. |
| 2006/0010018 A1 | * | 1/2006 | Bouriant ............... G05B 13/024 705/7.12 |
| 2011/0109085 A1 | * | 5/2011 | Nelson ....................... H02J 3/24 290/44 |
| 2012/0081824 A1 | | 4/2012 | Narendra et al. |
| 2012/0101640 A1 | * | 4/2012 | Stapelfeldt ............ F03D 7/0284 700/287 |
| 2012/0299305 A1 | * | 11/2012 | Brogan ..................... H02J 3/386 290/55 |
| 2013/0027994 A1 | * | 1/2013 | Nelson .................... H02P 9/105 363/40 |
| 2013/0141067 A1 | * | 6/2013 | Huang ..................... G05F 1/67 323/282 |
| 2014/0365021 A1 | * | 12/2014 | Workman .............. A01G 25/16 700/284 |
| 2015/0108846 A1 | * | 4/2015 | Xie ........................... H02J 3/24 307/102 |
| 2015/0214738 A1 | * | 7/2015 | Covic ....................... H02J 3/32 307/31 |
| 2015/0318705 A1 | * | 11/2015 | Lucas ..................... H02J 3/381 307/129 |
| 2016/0190922 A1 | * | 6/2016 | Malinin ................ H02M 3/156 323/271 |
| 2016/0254769 A1 | * | 9/2016 | Ren ......................... H02P 9/105 290/44 |
| 2017/0353036 A1 | * | 12/2017 | Gil Lizarbe ............ H02J 3/386 |

FOREIGN PATENT DOCUMENTS

| | | |
|---|---|---|
| JP | H1051943 A | 2/1998 |
| WO | 2014117388 A1 | 8/2014 |

OTHER PUBLICATIONS

International Search Report for Application No. PCT/DK2016/050188 dated Sep. 16, 2016.
Danish Search Report dated Mar. 11, 2016 for Application No. PA 2015 70403.

\* cited by examiner

METHOD OF OPERATING A DFIG WIND TURBINE UNDER SSR

FIELD OF THE INVENTION

The invention relates to the field of operating a doubly-fed induction generator (DFIG) wind turbine in the case of a sub-synchronous resonance event.

BACKGROUND

EP 2 357 483 A1 describes a method of detecting a sub-synchronous resonance event (SSR-event) by monitoring and evaluating line voltage.

SUMMARY OF THE INVENTION

According to a first aspect, a method is provided of protecting a wind turbine with a doubly-fed induction generator (DFIG) against a sub-synchronous resonance (SSR) event acting on the wind turbine. The method comprises:
  measuring a plurality of power-output values or current-output values over a given period of time that corresponds to a measurement cycle;
  determining whether power-output values or current-output values measured in the at least one measurement cycle are indicative of an SSR-event critical for further operation of the wind turbine, wherein the determining comprises monitoring whether at least one oscillation-parameter, obtained using the power-output values or the current-output values and representative of a power-output oscillation, exceeds at least one threshold for at least one measurement cycle, wherein it is a condition for determining the presence of an SSR-event critical for further operation of the wind turbine that the at least one oscillation-parameter exceeds the at least one threshold.
  shutting down the wind turbine in response to the measured power-output values or the measured current-output values being determined to be indicative of an SSR-event critical for further operation of the wind turbine.

According to a second aspect, a wind turbine controller of a wind turbine with a doubly-fed induction generator (DFIG) is provided. The wind turbine controller is arranged to protect the wind turbine against a sub-synchronous resonance (SSR) event acting on the wind turbine. The wind turbine controller is arranged to:
  receive a plurality of measured power-output values or current-output values over a given period of time that corresponds to a measurement cycle,
  determine whether power-output values or current-output values measured in the at least one measurement cycle are indicative of an SSR-event critical for further operation of the wind turbine, wherein the determining comprises monitoring whether at least one oscillation-parameter, obtained using the power-output values or the current-output values and representative of a power-output oscillation or a current-output oscillation, exceeds at least one threshold for at least one measurement cycle, wherein it is a condition for determining the presence of an SSR-event critical for further operation of the wind turbine that the at least one oscillation-parameter exceeds the at least one threshold
  shut down the wind turbine in response to the measured power-output values being determined to be indicative of an SSR-event critical for further operation of the wind turbine.

GENERAL DESCRIPTION, ALSO OF OPTIONAL EMBODIMENTS OF THE INVENTION

According to a first aspect, a method is provided of protecting a wind turbine with a doubly-fed induction generator (DFIG) against a sub-synchronous resonance (SSR) event acting on the wind turbine.

The converter system of the DFIG wind turbine is connected to a generator-rotor of the doubly-fed induction generator by the generator-side inverter of the converter system and to a fixed frequency electricity-grid (50 or 60 Hz) by the grid-side inverter of the converter system. The generator-stator is directly connected to the said fixed-frequency electricity-grid.

In general, the sub-synchronous resonance (SSR) phenomenon occurs in electrical power systems as a result of the interaction of a wind turbine generator with a long-distance series-compensated transmission line, i.e. a transmission line with a capacitance connected in series to the said transmission line. If a sub-synchronous resonance event occurs, the electrical network exchanges energy value with the wind turbine generator at frequencies less than the nominal frequency of the transmission line (50 or 60 Hz). Such sub-synchronous frequencies typically lie in a range between 10 and 45 Hz. This exchange of energy between the wind turbine generator-system and the electricity grid, usually accompanied by power-output oscillations of the wind turbine, may cause damage to wind turbine generator components and/or damage to components of the wind turbine converter system.

The method of protecting the DFIG-wind turbine against an SSR-event acting on the wind turbine comprises determining a plurality of power-output values or current-output values over a given period of time. The given period of time corresponds to a measurement cycle. Hence, a measurement cycle is herein defined as the given period of time for which a plurality of power-output values are measured. When the wind turbine is operated in accordance with the protection method described herein, at least one such measurement cycle is performed. Such measurement cycles are, for example, performed substantially continuously during on-time/the operation of the wind turbine to enable the wind turbine control-system to react to a sudden SSR-event at any time. The power-output values measured during a measurement cycle cover active power, apparent power and/or reactive power produced by the DFIG wind turbine generator-system and the converter-system connected thereto. They are, for example, measured by power-sensors placed at the wind turbine's coupling point to the electricity grid, which include, for example, current and voltage sensors. The current output values are measured by current sensors placed at the wind turbines coupling point to the electricity grid.

The method comprises determining whether power-output values or current-output values measured in the at least one measurement cycle are indicative of an SSR-event critical for further operation of the wind turbine.

The exchange of energy between the DFIG wind turbine generator system and the electricity grid is related to an SSR-event. The SSR-event, for example, goes along with power-output values and current-output values that are indicative of an SSR-event. To provide an example, the power-output values might oscillate at the sub-synchronous frequency of the SSR-event. Same is true for current-output values. Whether or not the SSR-event is critical for further operation of the wind turbine is determined based on the power-output values or current output values during at least one measurement cycle. Thereby the method discriminates, for example, between power-oscillations that correspond to non-critical SSR-events and those that correspond to critical ones. An SSR-event is, for example, considered to be critical for further operation of the wind turbine, if damping measures carried out by the DFIG wind turbine converter system or grid-components such as STATCOM's do not suffice to dampen the SSR-event and, hence, the SSR-event is, despite countermeasures, still amplifying.

The determination of whether or not the SSR-event is critical for further operation of the wind turbine comprises monitoring whether at least one oscillation-parameter exceeds at least one given threshold for at least one measurement cycle. The power-oscillation parameter is representative of the power-output oscillation. The power-oscillation parameter is obtained by using the power-output values or current output values of at least one measurement cycle. Exceeding this threshold is a condition for determining the presence of an SSR-event critical for further operation of the wind turbine. Critical for further operation of the wind turbine means in this context that the wind turbine could not continue operation without incurring damage caused by the present SSR-event.

There is, for example, a respective threshold for each oscillation-parameter obtained on the basis of the power-output values of at least one measurement cycle. Examples of such oscillation-parameters are the trend (increasing, decreasing or stationary) of power-output or current-output oscillation elongation, the energy content of the oscillation, etc. The power-output values used to obtain the oscillation-parameter have, for example, an individual timestamp. The timestamps of each power-output value or current output value determined in a measurement cycle are, for example, used to perform time-averaging of power-output values or current output values, integrating power-output values over time or determining the trend of the power-output values or current output values.

It is a condition for determining the presence of an SSR-event which is critical for further operation of the wind turbine that the oscillation-parameter exceeds the threshold for at least one measurement cycle. Hence in some examples, the SSR-event is, for example, determined to be critical for further operation of the wind turbine when the elongations of the output-power oscillation (reflected by the power-output values and/or the current-output values) are, for example, higher than a given threshold for three measurement cycles.

The method of protecting a DFIG wind turbine against an SSR-event acting on the wind turbine further comprises shutting down the wind turbine in response to the measured power-output values or current-output values being determined to be indicative of an SSR-event critical for further operation of the wind turbine.

If the above-mentioned condition (i.e. that the at-least-one oscillation parameters exceed the threshold) is fulfilled, and possible further conditions are also fulfilled, the power-output values are determined to be indicative of an SSR-event critical for further operation of the wind turbine and this leads to the above-mentioned shut down of the wind turbine.

Shutting down the wind turbine comprises, for example, shutting down the wind turbine converter system and control-electronics of the wind turbine. When shutting down the wind turbine, rotor blades may be pitched out of the wind and energy still produced by the wind-turbine generator, is, for example, dissipated by means of, for example, switchable high Ohmic resistors with sufficient thermal capacity or the like that are connected to the wind-turbine-generator terminals by a switch triggered when the wind turbine is shutting down.

In some embodiments, the monitoring of the at least one oscillation-parameter is triggered by a power-output value or a current-output value exceeding a given power threshold or a given current threshold, respectively.

Although the power-output and current-output of the DFIG wind turbine is, for example, continuously measured, is not necessary to determine the oscillation-parameter monitored to detect the presence of an SSR-event critical for further operation of the wind turbine, when the mere presence of an SSR-event is unlikely.

If, for example, the power-output or the current-output of the wind turbine is constantly at the demanded or rated level, without any runaways, no calculation or storage memory is required for determining and monitoring oscillation-parameters of any power-output oscillation or current-output oscillation, however small, since such a power-output oscillation or current-output oscillation, if present, is usually not indicative of an SSR-event critical for further operation of the wind turbine.

In some embodiments, the monitored oscillation-parameter is calculated based on differences between (i) measured power-output values or current-output values of a measurement cycle and (ii) a reference power output value or a reference current-output value, respectively.

These differences are integrated over time to obtain a power-output deviation-energy value or integrated current-output-deviation of a measurement cycle.

The power-output deviation-energy value or the integrated current-output deviation value of a measurement cycle is calculated, for example, by subdividing a measurement cycle into discrete time intervals and measuring a power-output value or a current-output value in each time interval of the measurement cycle. The beginning of such a time interval corresponds, for example, to the time-stamp of the power-output values or current-output values mentioned above. For each time interval, the difference between the measured power-output and the reference power-output value is calculated. Likewise, for each time interval, the difference between the measured current-output and the reference current-output is calculated. The reference power-output value is and the reference current-output value are, for example, the power-output or current-output currently demanded by the electricity grid or the wind turbine's power/current controller.

The differences between (i) the measured power-output value in a time interval of the measurement cycle and (ii) the reference power output value correspond to the deviations of the power-output from the reference power-output value in the time interval given by a measurement cycle.

Likewise, differences between (i) the measured current-output value in a time interval of the measurement cycle and (ii) the reference current output value correspond to the deviations of the current-output from the reference current-output value in the time interval given by a measurement cycle.

These differences (or the absolute values of these differences) are subsequently integrated over time for the duration of a measurement cycle. This is, for example, accomplished by calculating a function yielding all power-output deviation-energies by interpolating the differences to obtain a function of those differences over time and integrating this function over time, for example, for a timespan given by the duration of a measurement cycle.

However, in some embodiments the power-output deviation-energy value or the integrated current-output deviation value corresponds to the actual oscillation parameter monitored in order to determine the presence of an SSR-event critical for further operation of the wind turbine, but, in other embodiments serves only as an input variable for calculating the actual oscillation-parameter based on the power-output deviation-energy value or the integrated current-output-deviation value.

Yet when the power-output deviation-energy value or the integrated current-output deviation value serves only as the basis for calculating the oscillation-parameter, the oscillation-parameter is still determined on the basis of the power-output values or the current-output values as, no matter what manipulation of those power-output values or current-output values is performed to obtain the oscillation-parameter, the measured values underlying the oscillation-parameter are still the power-output values or the current-output values.

Provided that the power-output oscillation and the current-output oscillation are both centered around the reference power-output value or the reference current-output value, respectively, the more amplified the power-oscillation or current-oscillation becomes, the higher these power-output deviation-energy values or integrated current-output deviation values will become. Thereby, for example, these values serve as the basis of determining the oscillation-parameter.

The calculation of these values is performed, for example, by the wind turbine controller of the DFIG wind turbine that is arranged to calculate these value on the basis of measured power-output values or current-output values of a measurement cycle, received by the wind turbine controller.

In some embodiments, at least one power-output deviation-energy value or at least one integrated current-output deviation value is compared with a given first energy-threshold or a given first integrated current-deviation threshold, respectively. The power-output deviation-energy value or the integrated current-output-deviation value of the measurement cycle is stored if the said power-output deviation-energy value or integrated current-output-deviation exceeds the respective given first energy-threshold or said given first integrated current-deviation threshold.

The first energy-threshold or the given first integrated current-deviation threshold with which the at least one power-output deviation-energy value or integrated current-output deviation value is compared, respectively, depends, for example, either on momentary wind turbine operation parameters or is predetermined. Only those power-output deviation-energy values or integrated current-deviation values are stored that indeed exceeded the respective given energy-threshold. This ensures that only these values are used when the oscillation-parameter is calculated based on these values. Hence measurement cycles with a power-output deviation-energy value or integrated current-output deviation value below the respective given threshold do not contribute, for example, to obtaining the oscillation-parameter.

Accordingly, the wind turbine continues operation, for example, under the influence of a sufficiently dampened power-oscillation or current-oscillation indicative of an SSR-event, which often goes along with power-output values or current-output values that exceed the respective power or current-threshold, mentioned above, but with power-output deviation-energy values or integrated current-output values that are low and therefore do not exceed the above mentioned given first energy-threshold or the given first integrated current-output deviation threshold.

The value of the oscillation-parameter does not further approach values corresponding to an SSR-event critical for further operation of the wind turbine, and consequently to the wind turbine shutdown linked to it, when such measurement cycles occur with power-output deviation-energy values values or integrated current-output-deviation values below the respective threshold.

In some embodiments an accumulated power-output deviation-energy value or an accumulated integrated current-output-deviation value is calculated using stored power-output deviation-energy values or stored integrated current-output-deviation values obtained over a given number of successive measurement cycles. This accumulated power-output deviation-energy value or the accumulated integrated current-output-deviation value, for example, corresponds to the oscillation-parameter.

As measurement cycles are performed continuously when the wind turbine is operating, for example, a possible way of protecting the DFIG wind turbine against the SSR-event acting on the wind turbine is by shutting down the wind turbine when a single power-output deviation-energy value or a single integrated current-output deviation value is higher than the above-mentioned respective first energy-threshold or first integrated current-output-deviation threshold.

However, as the wind turbine's converter system and generator system, for example, still sustains an SSR-induced power-output oscillation or current-output oscillation with occasional exceeding power-output deviation-energy values or integrated current-output deviation values, this reaction could be unreasonable when, for example, only a single power-output deviation-energy value is higher than the above-mentioned first energy-threshold, at least for some wind turbines equipped with more robust DFIG type generators and corresponding converters.

Therefore, power-output deviation-energy values or integrated current-output-deviation values are obtained, for example, over ten successive measurement cycles and only the power-output deviation-energy values or integrated current-output deviation values that exceed the respective first energy-threshold are stored and used to calculate the respective accumulated power-output deviation-energy value or accumulated integrated current-output-deviation value.

In these ten measurement cycles, for example, only three power-output deviation-energy values, obtained in three measurement cycles out of ten measurement cycles, exceed the first energy-threshold. Accordingly, only these three power-output deviation-energy values are considered when the accumulated power-output deviation-energy value is calculated and other non-zero power-output deviation-energy values below the first energy-threshold are ignored. The same would be true in this example for integrated current-output-deviation values and their respective threshold.

Finally, for example, the accumulated power-output deviation-energy, calculated using the stored power-output deviation energy values, or the accumulated integrated current-output deviation value, calculated using the stored integrated current-output-deviation values, serves as the oscillation-parameter monitored to determine whether the measured power-output values or current-output values are indicative of an SSR-event critical for further operation of the wind turbine.

In some embodiments, the accumulated power-output deviation-energy value or the accumulated integrated current-output-deviation value is calculated by adding up stored power-output deviation-energy values or stored integrated current-output-deviation obtained over a given number of measurement cycles.

Hence, the accumulated power-output deviation-energy value or the accumulated integrated current-output-deviation value is, for example, a sum of the power-output deviation-energy values that exceed the first energy-threshold or a sum of the integrated current-output-deviation values that exceed the first integrated current-output-deviation threshold. One power-output deviation-energy value or integrated current-output-deviation is, for example, obtained for each measurement cycle of a given number of successive measurement cycles, and only those that exceed the respective first energy-threshold are added up to obtain the accumulated power-output deviation-energy value or the accumulated integrated current-output-deviation value.

In some embodiments, the stored power-output deviation-energy values or stored integrated current-output-deviation values were are obtained over a given number of preceding measurement cycles, by storing power-output deviation-energy values exceeding the said first energy-threshold or stored integrated current-output-deviation values exceeding said first integrated current-deviation threshold, the accumulated power-output deviation-energy value or the accumulated integrated current-output-deviation value being calculated using power-output deviation-energy values or integrated current-output deviation values which were obtained over the given number of preceding measurement cycles.

The power-output deviation-energy values or integrated current-output deviation values are, for example, calculated for each successive measurement cycle and continuously compared with the respective first energy-threshold or first integrated current-output deviation threshold. The method takes, for example, the last ten measurement cycles into account for picking out and storing power-output deviation-energy values or integrated current-output-deviation values that exceed the respective first energy-threshold and are therefore used for calculating the accumulated power-output deviation-energy values or integrated current-output-deviation values of the last ten measurement cycles.

When the next measurement cycle is started and thereby the next power-output deviation-energy value or integrated current-output-deviation value is calculated, the oldest previously considered measurement cycle is not considered anymore but instead the power-output deviation energy value or integrated current-output-deviation value of the newly started measurement cycle is considered, such that again the ten most up-to-date measurement cycles, more precisely, the power-output deviation-energy values or integrated current-output-deviation values obtained during these measurement cycles, are considered for picking up and storing the power-output deviation-energy values or integrated current-output-deviation values that exceed the respective first threshold.

In these embodiments, the accumulated power-output deviation-energy value or accumulated integrated current-output-deviation value is calculated using the stored power-output deviation-energy values which were obtained over the given number of preceding measurement cycles, corresponding, in the above example, to the last ten measurement cycles.

In some embodiments, the accumulated current-output-deviation value or the accumulated power-output deviation-energy value is compared with a respective given second energy-threshold or a second integrated current-output deviation threshold.

It is a condition for determining an SSR-event critical for further operation of the wind turbine that the accumulated power-output deviation-energy value or the accumulated integrated current-output-deviation value, serving in this example as oscillation-parameter, exceed the respective threshold. Using only this condition might suffice to determine the presence of an SSR-event critical for further operation of the wind turbine, however, for example, it might be required that at least one other condition is fulfilled to arrive at this result.

In some embodiments, the power-output oscillation being determined to be associated with an SSR-event critical for further operation of the wind turbine in response to the accumulated power-output deviation-energy value or the accumulated integrated current-output deviation value exceeding the given second energy-threshold or the given second integrated current-output deviation threshold and the trend of the power-output deviation-energy values or the integrated current-output deviation values being increasing over the given number of preceding measurement cycles.

The trend of the power-output deviation-energy values or the integrated current-output-deviation values indicates whether the power-output deviation-energy or the integrated current-output-deviation value is increasing, decreasing or substantially constant over successive measurement cycles. A gradient of an increasing trend is, for example, used as the oscillation-parameter. If the gradient of this increasing trend exceeds a corresponding threshold from one measurement cycle to the other or over the given number of measurement cycles considered, this might serve as a condition for the presence of an SSR-event critical for further operation of the wind turbine.

However, the above described trend taken by itself also serves in some examples as the representative of the output-power oscillation or the current-output oscillation. If, the trend is "increasing", for example, this provides, for example, a condition for determining the presence of an SSR-event critical for further operation of the wind turbine.

In some embodiments, the power-output oscillation or the current-output oscillation is determined to be associated with an SSR-event critical for further operation of the wind turbine in response to the accumulated power-output deviation-energy value or the accumulated integrated current-output deviation value exceeding the respective given second energy-threshold or second integrated current-output deviation threshold and the trend of the power-output deviation-energy values or the integrated current-output deviation values are increasing over the given number of preceding measurement cycles.

Hence, in this example, two conditions are necessary to determine the measured power-output values or current-output values to be indicative of an SSR-event critical for further operation of the wind turbine. Firstly, the accumulated power-output deviation-energy value or accumulated integrated current-output-deviation value has to exceed the respective second-energy-threshold or or second integrated current-output-deviation threshold and, secondly, the trend of the power-output deviation-energy values or the integrated current-output deviation values has to be increasing.

Thereby, it is ensured that occasional peaks of the power-output oscillation's elongation magnitude or the current-output oscillation's elongation magnitude do not lead to the measured power-output values being determined to be indicative of an SSR-event critical for further operation of the wind turbine. But rather, this is only then the case, when both conditions are fulfilled, which means that the power/current-output oscillation around the reference power/current-output value (represented by the power-output deviation-energy values or the integrated current-output—deviation value, respectively) has a high oscillation-energy content and this oscillation-energy content is, moreover, increasing over the measurement cycles considered.

When active SSR-damping methods are carried out by the wind turbine converter system, and the above-mentioned conditions are still fulfilled, this implies that the active damping is insufficient and, despite damping, the ongoing SSR-event is determined to be critical for further operation of the wind turbine.

In some embodiments, the stored values of the power-output deviation-energy or the integrated current-output-deviation are refreshed when the given number of measurement cycles have passed without any power-output deviation-energy value or integrated current-output deviation value exceeding the respective given first energy-threshold or the given first integrated current-deviation threshold.

When the first energy-threshold or integrated current-output-deviation threshold is not exceeded by any determined and stored power-output deviation-energy value or integrated current-output-deviation value within the given number of measurement cycles, the stored values of the power-output deviation-energy or the integrated current-output-deviation are refreshed, e.g. as they are overwritten by more up-to-date values. This saves consumed computation memory, as no irrelevant data, which does not correspond to measured power-output values or current-output values indicative of an SSR-event critical for further operation of the wind turbine, is kept in the storage.

Furthermore, the accumulated power-output deviation-energy value or accumulated integrated current-output deviation value is, for example, set to zero again, when the given number of measurement cycles has passed and the power-output deviation-energy value did not exceed the respective second energy-threshold or second integrated current-output-deviation threshold over that given number of measurement cycles.

Thereby, it is ensured that the accumulated power-output deviation-energy value or accumulated integrated current-output-deviation value does not exceed the given second energy-threshold or integrated current-output deviation threshold, just because power-output deviation-energy values or integrated current-output-deviation values were accumulated for more measurement cycles than the given number of measurement cycles.

In some embodiments the oscillation-parameter is a counter value of power-output values or current-output values that exceed a given power-output limit or a given current-output limit, during a single measurement cycle.

Counting the number of measured power-output values or current-output values that exceed the given power-output limit or a given current-output limit during a single measurement cycle, provides a measure of whether the power-output values or current output values are indicative of an SSR-event critical for further operation of the wind turbine, as exceeding power-output values and exceeding current-output values correspond, for example, to exceeding elongation magnitudes of an SSR-induced power-output oscillation and current-output oscillations, respectively.

The higher such elongation magnitudes of the power/current-output-oscillation become, the more dangerous these SSR-induced oscillations will become for wind turbine components.

Therefore, the counter value of such excessive elongations of the power-output oscillation or current-output oscillation serves, for example, as the oscillation-parameter indicative of the presence of an SSR-event critical for further operation of the wind turbine.

In some embodiments, the power-output values or current-output values are determined to be indicative of an SSR-event critical for further operation of the wind turbine in response to the counter value of power-output values exceeding a given power-output limit or the counter value of current-output values exceeding a given current-output limit during the single measurement cycle is greater than a given admissible number of exceeding power-output values or exceeding current-output values per measurement cycle.

As mentioned above, the counter value of power-output values or current-output values exceeding a respective given power-output limit or given current-output limit during the single measurement cycle serves, for example, as the oscillation parameter. The threshold to which this oscillation parameter is compared is given, for example, by the admissible number of exceeding power-output values or current-output values per measurement cycle, respectively. If the count exceeds the given admissible number of exceeding power-output values or exceeding current-output values, the power-output values or the current-output values are determined to be indicative of an SSR-event critical for further operation of the wind turbine.

An example is provided by power-output values that exceed a power-output limit of 2.5 MW for more than four times (admissible number of exceeding power-output values) in a period of 200 ms, corresponding to ten successive output-power measurements (measurement cycle).

In some embodiments, the power-output limit is given by 125 percent of the wind turbine converter system's nominal active power-output and the current-output limit is given by 125 percent of the wind turbine converter system's nominal current-output.

If, for example, the nominal power-output of the wind turbine is set to 2 MW, the power-output limit is then given by 2.5 MW, as in the above example.

According to a second aspect, a wind turbine controller of a wind turbine is provided with a doubly-fed induction generator (DFIG). The wind turbine controller is arranged to protect the wind turbine against a sub-synchronous resonance (SSR) event acting on the wind turbine. The wind turbine controller is arranged to receive a plurality of measured power-output values or current-output values over a given period of time that corresponds to a measurement cycle. The wind turbine controller is further arranged to determine whether power-output values or current-output values measured in the at least one measurement cycle are indicative of an SSR-event critical for further operation of the wind turbine, wherein the determining comprises monitoring whether at least one oscillation-parameter, obtained using the power-output values or the current-output values and representative of a power-output oscillation or a current-output oscillation, exceeds at least one threshold for at least one measurement cycle. It is a condition for determining the presence of an SSR-event critical for further operation of the wind turbine that the at least one oscillation-parameter exceeds the at least one threshold. The wind turbine controller is further arranged to shut down the wind turbine in response to the measured power-output values or current-output values being determined to be indicative of an SSR-event critical for further operation of the wind turbine.

Furthermore, the wind turbine controller is arranged to carry out any one of the exemplary methods of operating a DFIG wind turbine in the case of an SSR-event acting on the wind turbine described above.

BRIEF DESCRIPTION OF THE DRAWINGS

Exemplary embodiments of the invention are now described, also with reference to the accompanying drawings, wherein FIG. 1 schematically illustrates a wind turbine with a power-generating system shown in more detail in FIG. 2.

The drawings and the description of the drawings are of examples of the invention and are not of the invention itself. Like reference signs refer to like elements throughout the following description of embodiments.

DESCRIPTION OF EMBODIMENTS

Figure 1:
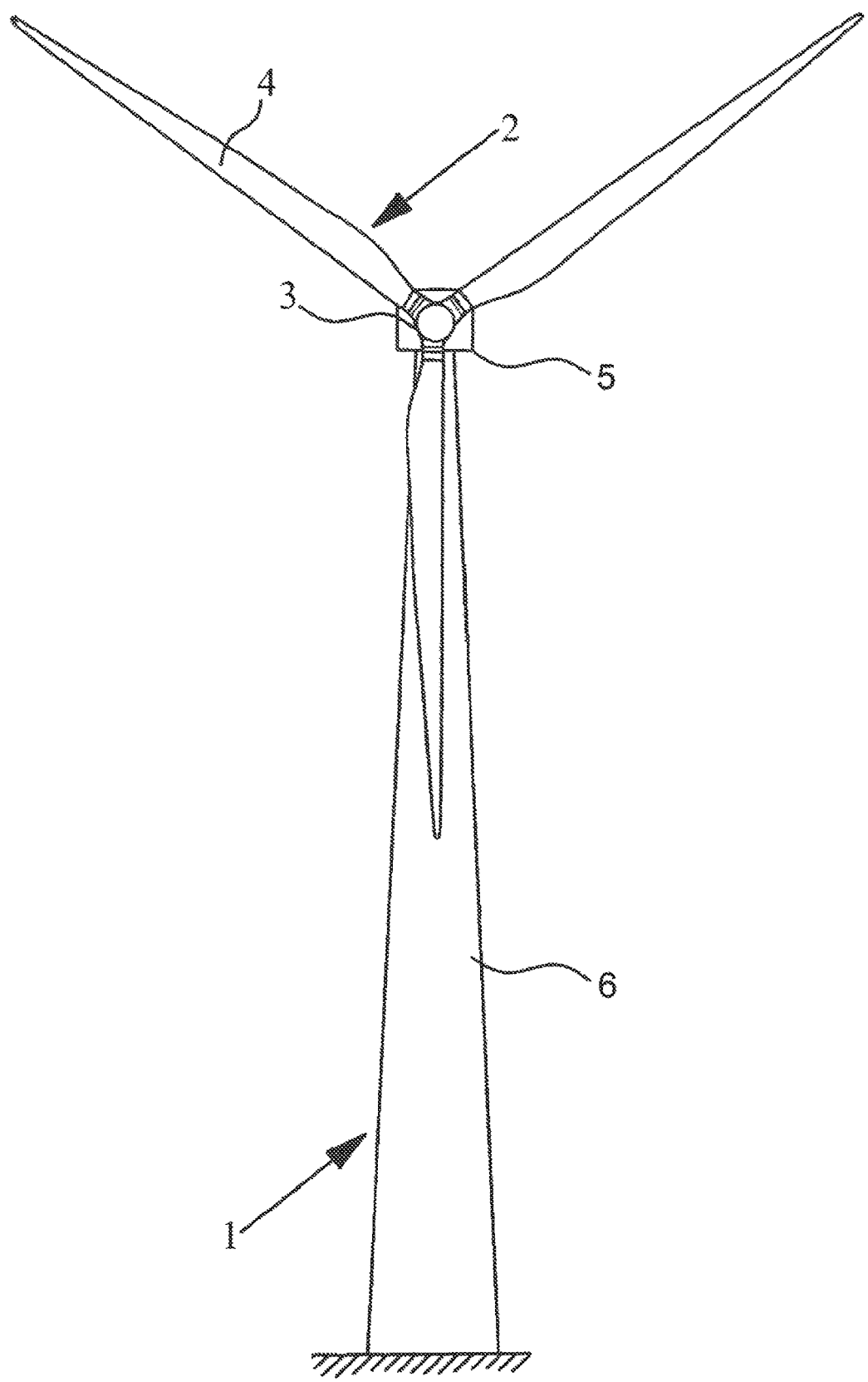

A wind turbine 1, shown in FIG. 1 comprises a nacelle 5, mounted atop a tower 6. A rotor 2, driving a DFIG wind turbine generator 10 (not shown) comprises rotor-blades 4 mounted on a hub 3.

Figure 2:
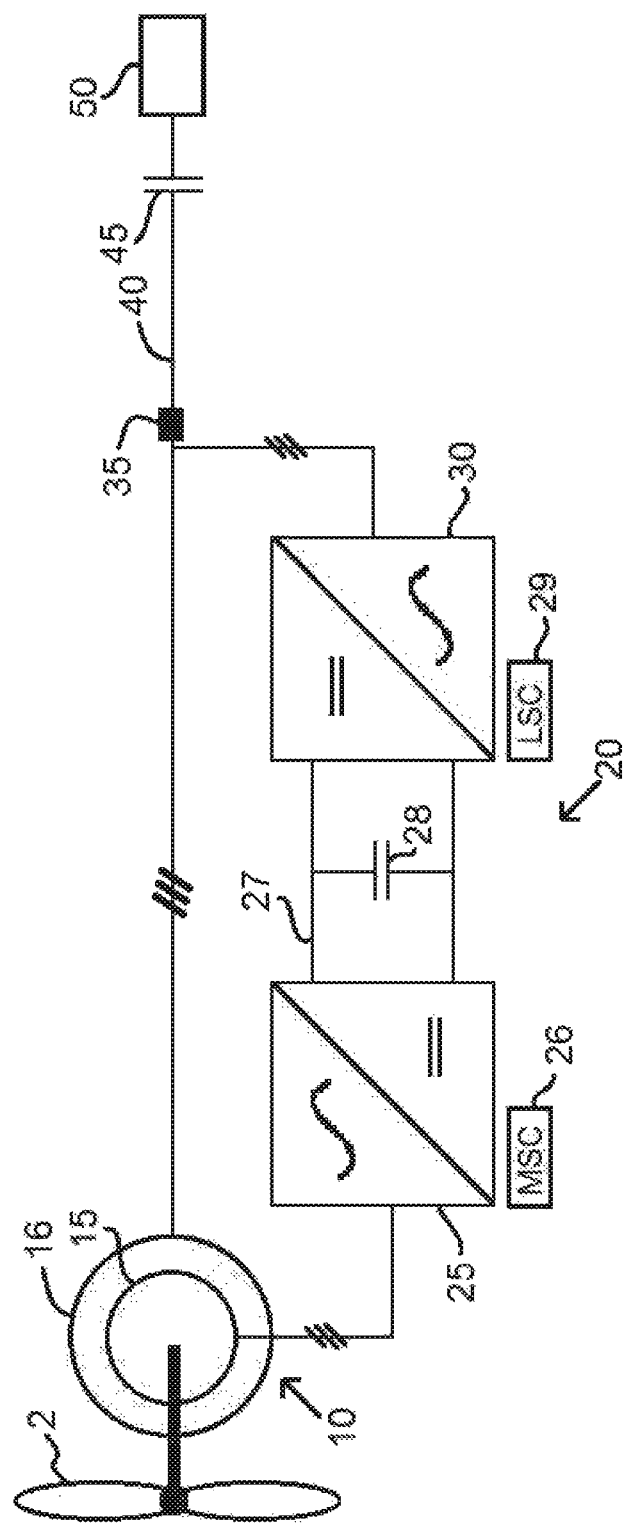
FIG. 2 is a schematic circuit diagram of a DFIG wind turbine's power generating system connected to a series-compensated power transmission line, FIG. 3 schematically illustrates a wind park connected to a series-compensated power transmission line.

A wind turbine generator 10, coupled to an electricity grid 50 is schematically illustrated in FIG. 2. A generator-rotor 15 of the wind turbine generator is driven by a rotor 2. The rotor 15 is coupled to a converter 20. The generator and the converter together built the power-generating system of the wind turbine 1, shown in FIG. 1. The machine-side inverter 25 of the converter 20 sets rotor-voltages and rotor-currents and thereby induces a magnetic flux in the generator-rotor 15, which may rotate faster than the rotor 2 or slower than rotor 2, depending on the current wind speed and the current desired power production of the wind turbine. The generator-side inverter 25 is, in turn, controlled by the generator-side inverter controller 26.

The machine-side inverter 25 is connected to a grid-side inverter 30 by a DC link 27, comprising a capacitor 28 as an energy storage element. The grid-side inverter 30, however, receives branched off three-phase currents that are used to feed the generator-rotor 10 via the converter system 20. The grid-side inverter 30 is controlled by a grid-side converter controller 29.

The generator-stator 16, in turn, is connected directly to the grid 50, via a series-compensated power transmission line 40. The power-output of the wind turbine is measured by a power/current-output measurement device 35. The series-compensation is given by a capacitor 45 connected in series to the power transmission line 40. The generator-rotor 15 induces fixed-frequency, e.g. 50 Hz, AC currents in the generator stator 16, to produce power (the currents in the rotor are set by the converter-system 20 such that the fixed-frequency current in the stator is reached).

Figure 3:
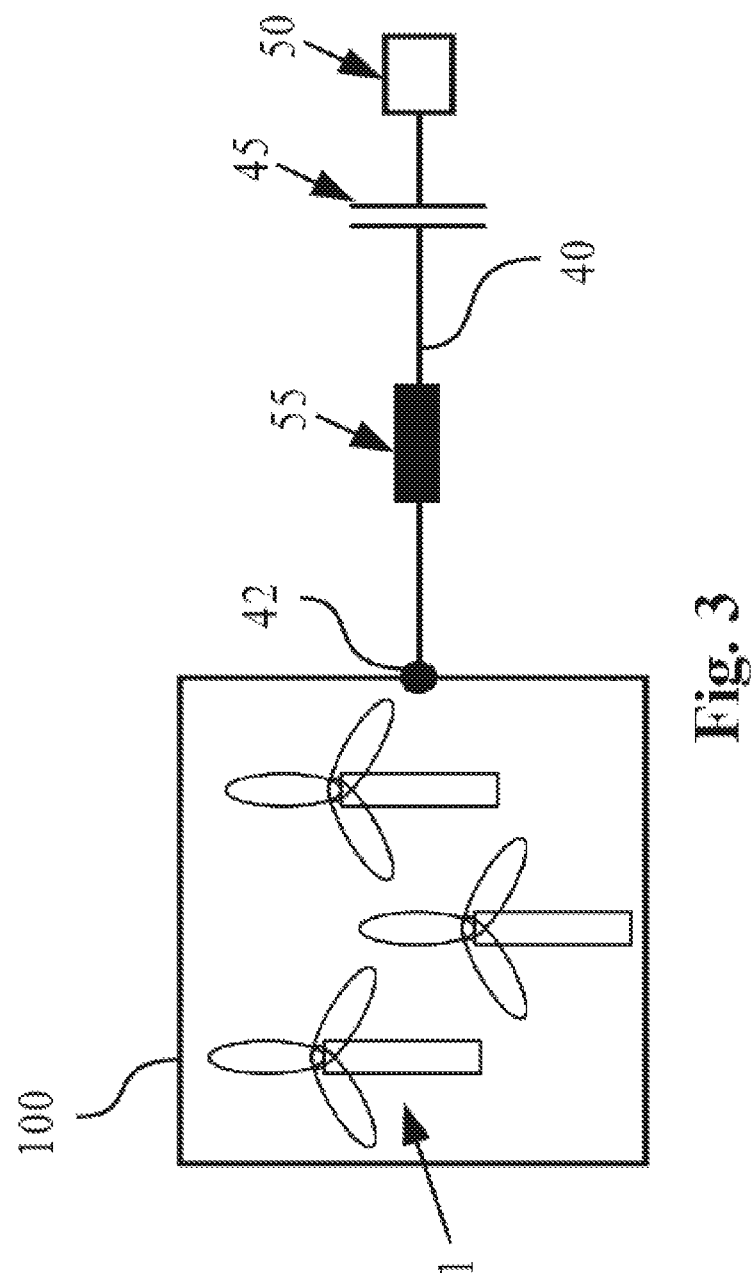

A wind park 100, including several wind turbines 1 and a point of common coupling 42 to an electricity grid 50 is shown in FIG. 3. The wind turbines 1 of the wind park 100 are each connected to the point of common coupling 42, at which the wind park 100 is connected to the electricity-grid 50. The wind park feeds power to the electricity grid 50 via a series-compensated power transmission line 40. The series-compensation is achieved by connecting a capacitor 45 in series to the power transmission line 40. The inductivity 55 of the power-transmission line is schematically illustrated by inductance 55. An SSR-event occurring due to the series-compensation of power line 40, caused by the insertion of the capacitor 45, may spread through the point of common coupling 42 to the wind park 100, and thereby affect several wind turbines 1 of the wind park 100. This may cause massive damage to the wind turbines 1 of the wind park 100.

To prevent such an effect, the wind turbines 1 are protected by a protection method, capable of determining whether measured power-output values or current-output values are indicative of an SSR-event critical for further operation of the wind turbine and of shutting down the wind turbine if the result of the determination indeed points to such a critical SSR-event.

Throughout the following description of FIGS. 4 to 11, illustrating the method and underlying SSR-induced power/current output oscillations in more detail, the "integrated current-output-deviation" is referred to as "current-output deviation energy" or simply "deviation-energy". The "accumulated integrated current-output-deviation value" is referred to as "accumulated current-output deviation-energy". The "first integrated current-output-deviation threshold" is as the threshold for power-output deviation-energies also shortly referred to as "first energy threshold". In this way also the "second integrated current-output deviation threshold" is shortly referred to as "second energy threshold".

Figure 4:
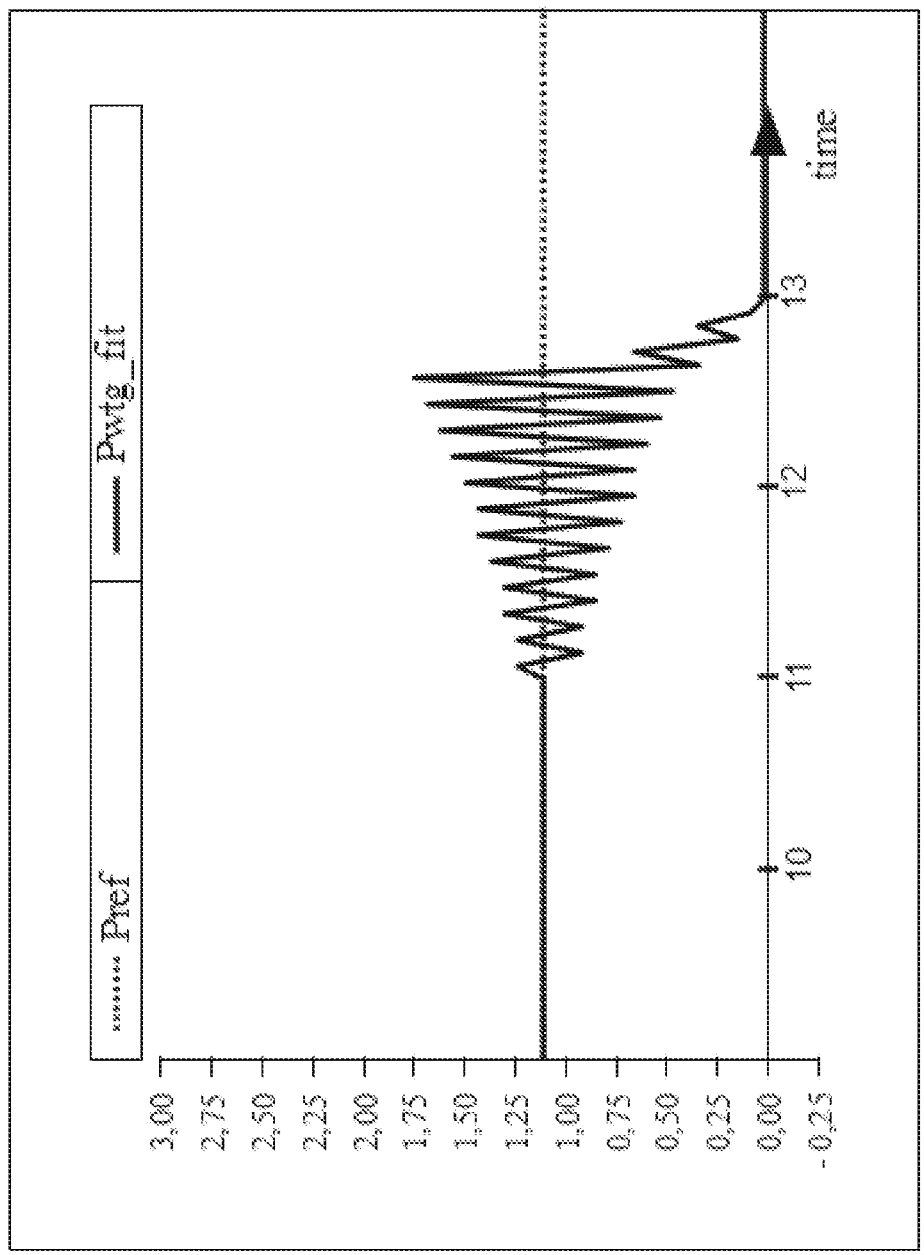
FIG. 4 is a diagram of undamped power-output oscillations, caused by an undamped SSR-event, over time including the moment of shutting down the DFIG wind turbine.

A diagram of undamped power-output oscillations around a reference power-output value over time is given by FIG. 4. Approximately at 11 s a power-output oscillation begins, induced by an SSR-event. From this moment on, the power-output oscillation is amplifying.

At approximately 12.6 s the condition is reached at which the power-output values are determined to be indicative of an SSR-event critical for further operation of the wind turbine. This condition is reached in this example, as an accumulated power-output deviation-energy (corresponding to an area under the curve) obtained over eight successive measurement cycles a 200 ms has exceeded the given second energy threshold for that oscillation. The accumulated power-output deviation-energy value corresponds in this example to the area under the curve from 11 s to approximately 12.6 s. The wind turbine is shut down at approximately 13 s to prevent damage to the wind turbine's components caused by the amplifying power oscillation induced by the SSR-event critical for further operation of the wind turbine.

Figure 5:
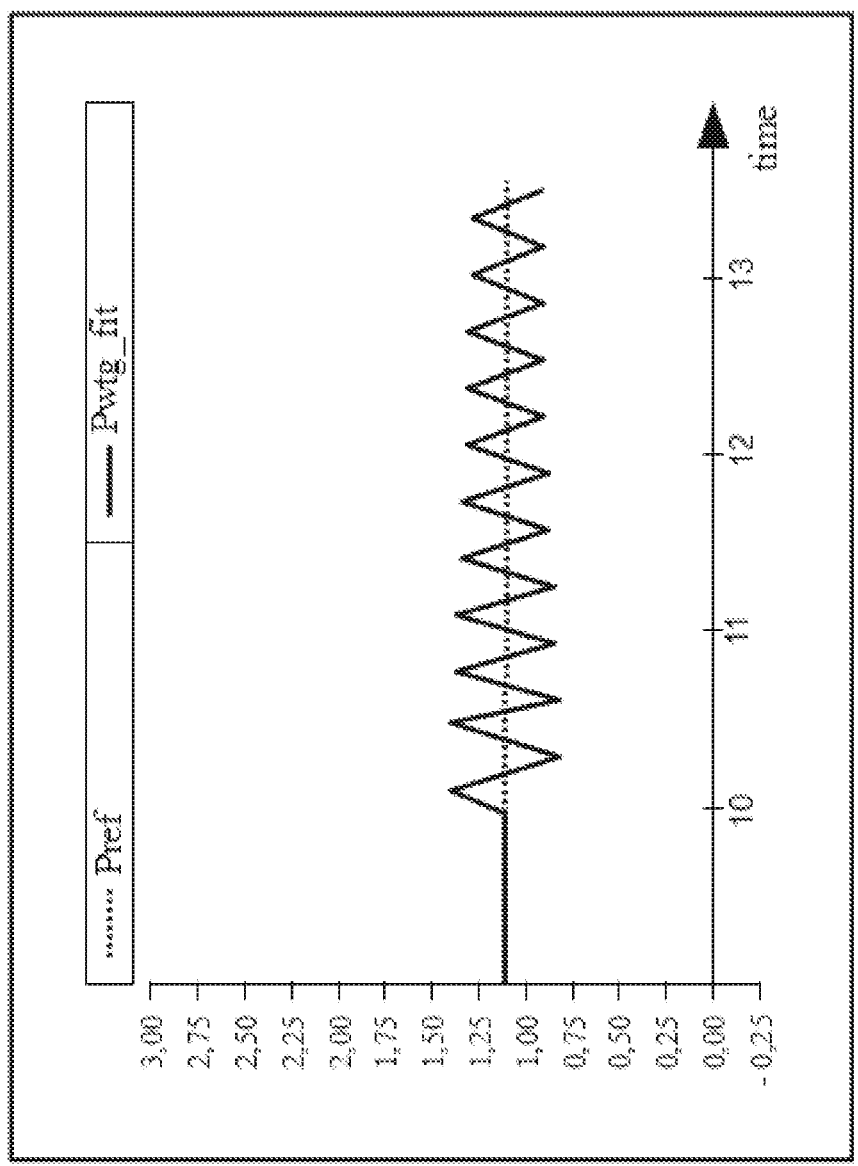
FIG. 5 is a diagram of damped-out power-output oscillations, caused by a damped SSR-event, over time, wherein the DFIG wind turbine is kept in operation.

A diagram of damped power-output oscillations around a reference power-output value over time is given by FIG. 5. The power-output oscillation occurs at approximately 10 s and it is still present after 13 s have passed. As can be seen from the elongation-magnitude of the power-output oscillation, the oscillation is slightly dampened and no longer amplifying. An accumulated power-output deviation-energy value obtained over 8 successive measurement cycles à 200 ms, for example measured from timestamps 10 s to 11.6 s, does not exceed the given second energy-threshold.

The determination of that accumulated power-output deviation-energy value was triggered by a power-output exceeding the power-threshold at approximately timestamp 10 s. After resetting the accumulated power-output deviation-energy value, i.e. setting the accumulated power-output deviation-energy value to zero again, a new accumulated power-output deviation-energy value is calculated using the power-outputs obtained in the measurement cycles from 10.2 s to 11.8 s (again the last eight measurement cycles) and is again compared to the second energy threshold. This accumulated power-output deviation-energy obtained in the cycles from 10.2 s to 11.8 s does not exceed the second-energy threshold either, and so on. Hence, the damped power-output oscillation, shown in FIG. 5, does not correspond to power-output values that are determined to be indicative of an SSR-event critical for further operation of the wind turbine by the method of protecting the DFIG wind turbine. Instead, the wind turbine is kept online during the SSR-event.

Figure 6:
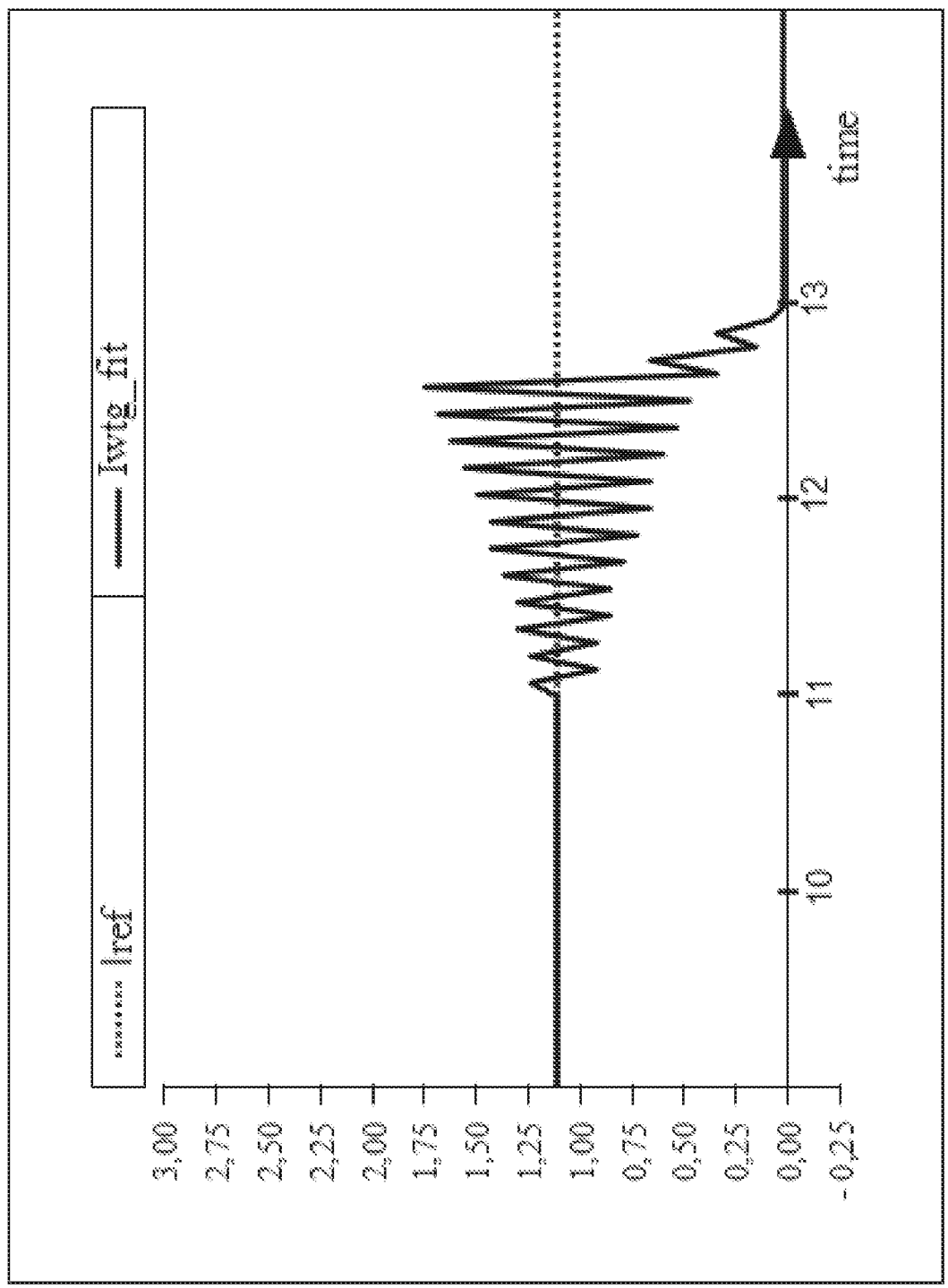
FIG. 6 is a diagram of undamped current-output oscillations, caused by an undamped SSR-event, over time, including the moment of shutting down the DFIG wind turbine.

A diagram of undamped current-output oscillations around a reference current-output value for a DFIG-wind turbine injecting current into the grid at a voltage of 1 kV, over time is given by FIG. 6. Approximately at 11 s a power-output oscillation begins, induced by an SSR-event. From this moment on, the current-output oscillation is amplifying.

At approximately 12.6 s the condition is reached at which the current-output values are determined to be indicative of an SSR-event critical for further operation of the wind turbine. This condition is reached in this example, as an accumulated integrated current-output-deviation value (corresponding to an area under the curve) obtained over eight successive measurement cycles à 200 ms has exceeded the given second integrated current-output-deviation threshold for that oscillation. The accumulated integrated current-output-deviation value corresponds in this example to the area under the curve from 11 s to approximately 12.6 s. The wind turbine is shut down at approximately 13 s to prevent damage to the wind turbine's components caused by the amplifying current oscillation induced by the SSR-event critical for further operation of the wind turbine.

Figure 7:
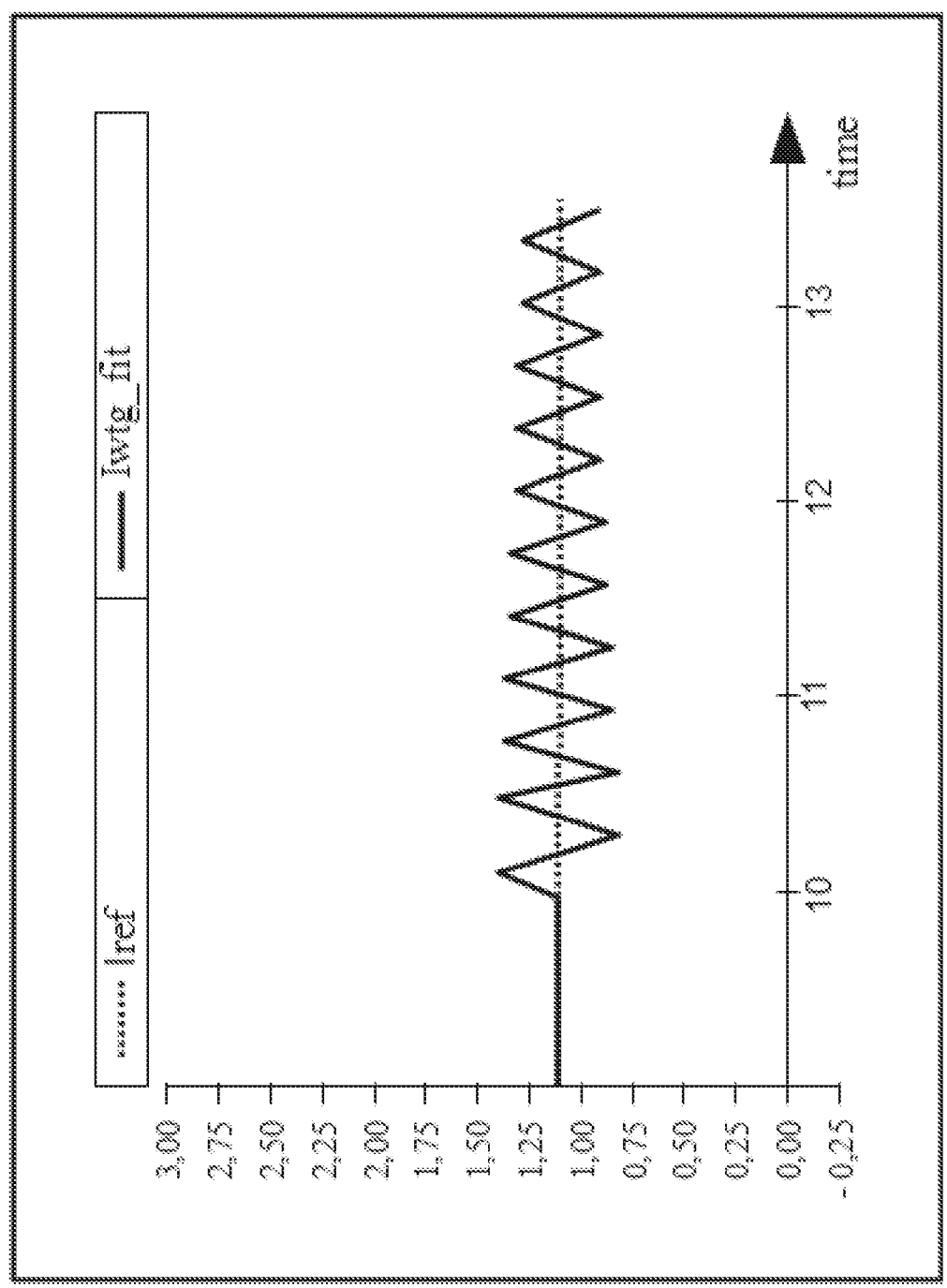
FIG. 7 is a diagram of damped-out current-output oscillations, caused by a damped SSR-event, over time, wherein the DFIG wind turbine is kept in operation.

A diagram of damped current-output oscillations around a reference current-output value over time is given by FIG. 7. The current-output oscillation occurs at approximately 10 s and it is still present after 13 s have passed. As can be seen from the elongation-magnitude of the current-output oscillation, the oscillation is slightly dampened and no longer amplifying. An accumulated integrated current-output-deviation value obtained over 8 successive measurement cycles à 200 ms, for example measured from timestamps 10 s to 11.6 s, does not exceed the given second integrated current-output-deviation threshold.

The determination of that accumulated power-output deviation-energy value was triggered by a current-output exceeding the current-threshold at approximately timestamp 10 s. After resetting the accumulated integrated current-output-deviation value, a new accumulated integrated current-output-deviation value is calculated using the current-outputs obtained in the measurement cycles from 10.2 s to 11.8 s (again the last eight measurement cycles) and is again compared to the second integrated current-output-deviation threshold. This accumulated current-output-deviation value obtained in the cycles from 10.2 s to 11.8 s does not exceed the second integrated current-output-deviation threshold either, and so on. Hence, the damped current-output oscillation, shown in FIG. 7, does not correspond to an SSR-event critical for further operation of the wind turbine. The wind turbine is kept online during the SSR-event.

Figure 8:
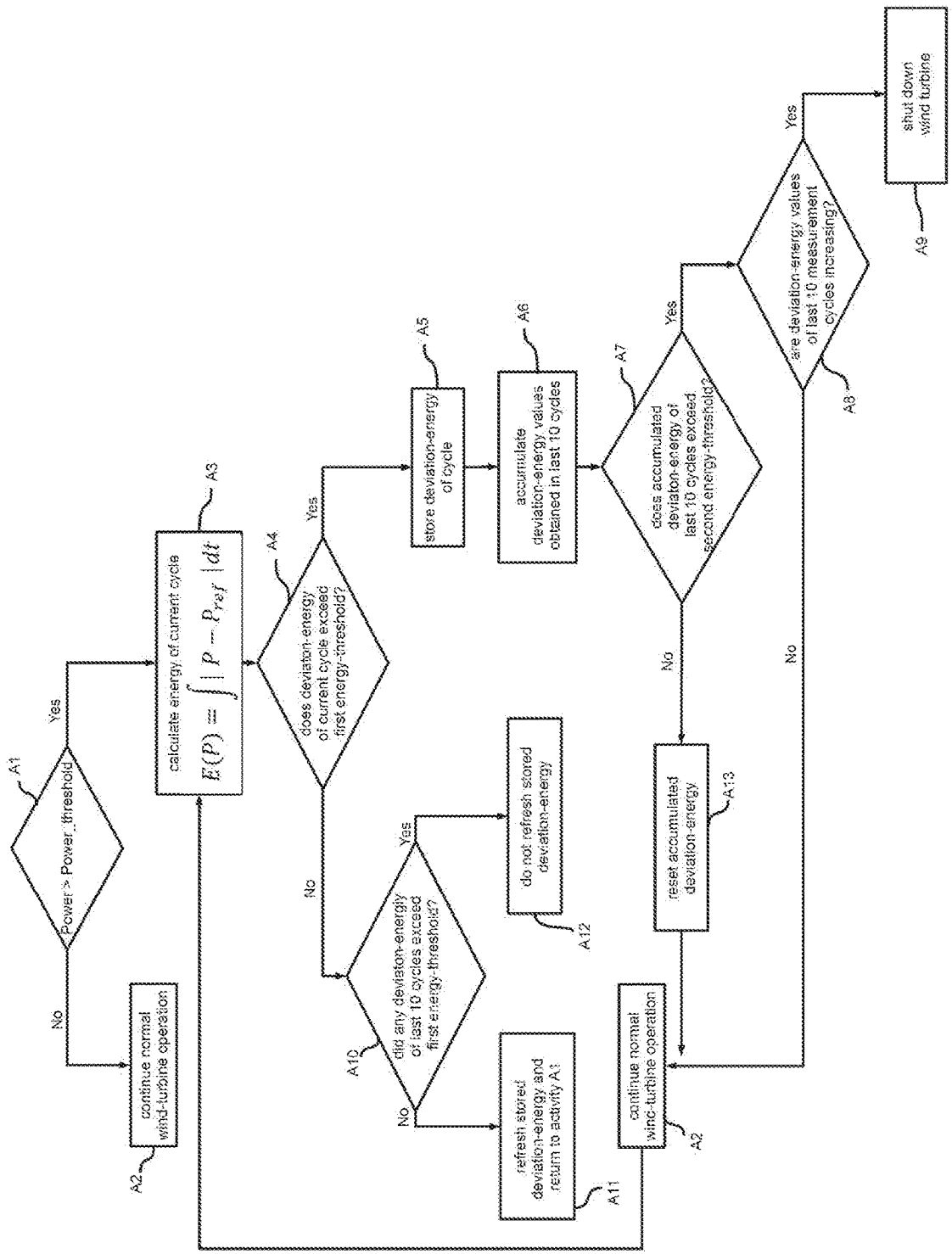
FIG. 8 is a schematic block-diagram illustrating an exemplary method of protecting the DFIG wind turbine against an SSR-event, with an accumulated power-output deviation-energy value as the oscillation parameter.

A schematic block-diagram, illustrating an exemplary method of protecting a wind turbine against an SSR-event acting on the wind turbine, wherein power-output deviation-energy values are used as the oscillation parameter is given by FIG. 8.

In activity A1, an evaluation is made of whether a momentary power-output of the wind turbine exceeds a given power threshold. If the given power-threshold is not exceeded, normal wind turbine operation is continued in an activity A2 without any calculation of an oscillation parameter. However, if the current power exceeds the given power-threshold, the oscillation parameter is obtained for a current measurement cycle. In each measurement cycle a plurality of power-output values are obtained in a given time-span, such as 500 ms or the like.

In the example of FIG. 8 the oscillation parameter indicative of the presence of an SSR-event critical for further operation of the wind turbine is an accumulated power-output deviation-energy value obtained based on power-output deviation-energy values. The power-output deviation-energy is calculated in activity A3 for a measurement cycle corresponding to a time window, by integrating the absolute value of the difference between (i) a reference output-power demanded by the electricity grid and (ii) power-output values, obtained within that time window, over time.

In an activity A4 it is tested whether the output-power deviation energy obtained in activity A3 exceeds a first energy-threshold. If the first energy-threshold is indeed exceeded, the exceeding power-output deviation-energy value of the measurement cycle is stored.

In an activity A6, the exceeding power-output deviation-energy values, which were stored over the last ten measurement cycles, hence those power-output deviation-energy values obtained in the last ten measurement cycles that exceeded the first energy-threshold, are accumulated by adding up the deviation-energy values. The resulting accumulated power-output deviation-energy—serving as the oscillation parameter in this example—is compared with a second energy-threshold in activity A7. Furthermore, a trend of the power-output deviation energy values, e.g. "increasing", "decreasing" or "substantially constant", is determined in activity A8. This determination in activity A8 is rather a background process and is not necessarily carried out after the accumulated power-output deviation-energy has been compared to the second energy-threshold.

If (i) the accumulated power-output deviation energy exceeds the given threshold and (ii) the trend of the power-output deviation energy values has been increasing over the last ten measurement cycles, the wind turbine is shut down in activity A9.

If the accumulated power-output deviation-energy obtained in activity A6 does not exceed the second energy-threshold, the accumulated deviation-energy is reset in activity A13. It is set to zero so that in the next measurement cycle the accumulated power-output deviation energy values can be obtained for the ten measurement cycles preceding the next measurement cycle.

After resetting the accumulated power-output deviation-energy in activity A13, the wind turbine continues normal operation in activity A2. Even if the accumulated power-output deviation-energy exceeds the second energy-threshold but, however, the trend of the power-output deviation-energy values is not increasing, the wind turbine continues normal operation in activity A2. Hence, only if both conditions (i) and (ii), named above, are fulfilled, is the wind turbine shut down in activity A9.

If the power-output deviation energy of the current cycle does not exceed the given first energy-threshold in activity A4, it is checked in activity A10 whether any deviation-energy of the last ten measurement cycles exceeded the first energy-threshold. If this is not the case, the stored power-output deviation-energy values are refreshed in activity A11, for example, by deleting stored deviation-energy values that were obtained before the last ten measurement cycles considered and replacing them with newly acquired power-output deviation-energy values that are stored as they exceed the first energy-threshold. After refreshing the stored power-output deviation-energy values, the method returns to activity A1, where the current power-output of the wind turbine is compared with the given first power-threshold.

Figure 9:
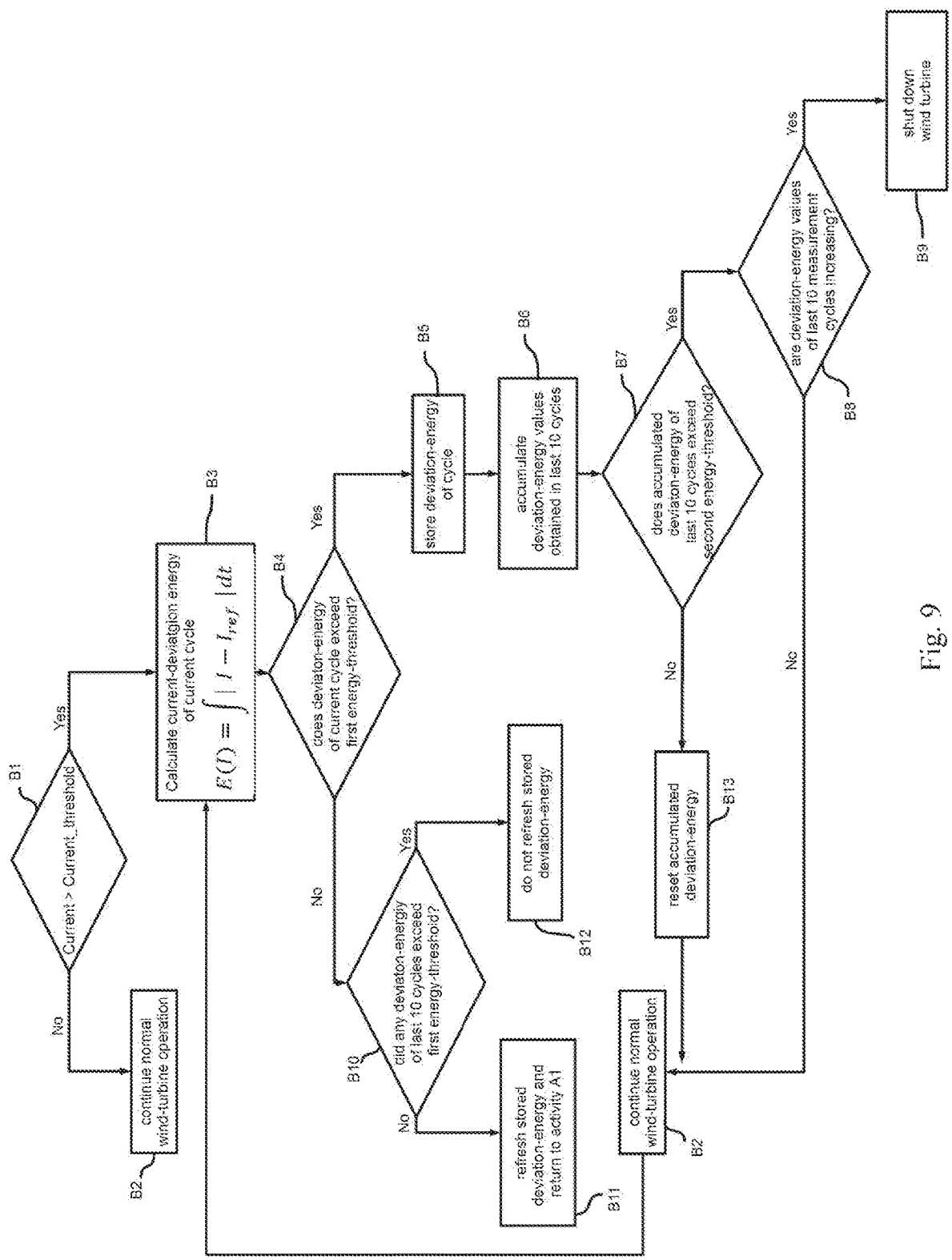
FIG. 9 is a schematic block-diagram illustrating an exemplary method of protecting the DFIG wind turbine against an SSR-event, with an accumulated integrated current-output-deviation value as the oscillation parameter.

A schematic block-diagram, illustrating an exemplary method of protecting a wind turbine against an SSR-event acting on the wind turbine, wherein an accumulated integrated current-output-deviation energy value, is given by FIG. 9.

In activity B1, an evaluation is made of whether a momentary current-output of the wind turbine exceeds a given current threshold. If the given current-threshold is not exceeded, normal wind turbine operation is continued in an activity B2 without any calculation of an oscillation parameter. However, if the momentary current exceeds the given current-threshold, the oscillation parameter is obtained for a current measurement cycle. In each measurement cycle a plurality of power-output values are obtained in a given time-span, such as 500 ms or the like.

In the example of FIG. 9 the oscillation parameter indicative of the presence of an SSR-event critical for further operation of the wind turbine is an accumulated power-output deviation-energy value obtained based on current-output deviation-energy values. The current-output deviation-energy is calculated in activity B3 for a measurement cycle corresponding to a time window, by integrating the absolute value of the difference between (i) a reference current-output demanded by the electricity grid and (ii) current-output values, obtained within that time window, over time.

The following activities B4 to B13 are analogous to the activities A4 to A13 that were described in detail in conjunction with FIG. 8. The only difference is that an accumulated current-output deviation-energy, i.e. an accumulated integrated current-output-deviation value is used as the oscillation parameter instead of an accumulated power-output deviation-energy value.

Figure 10:
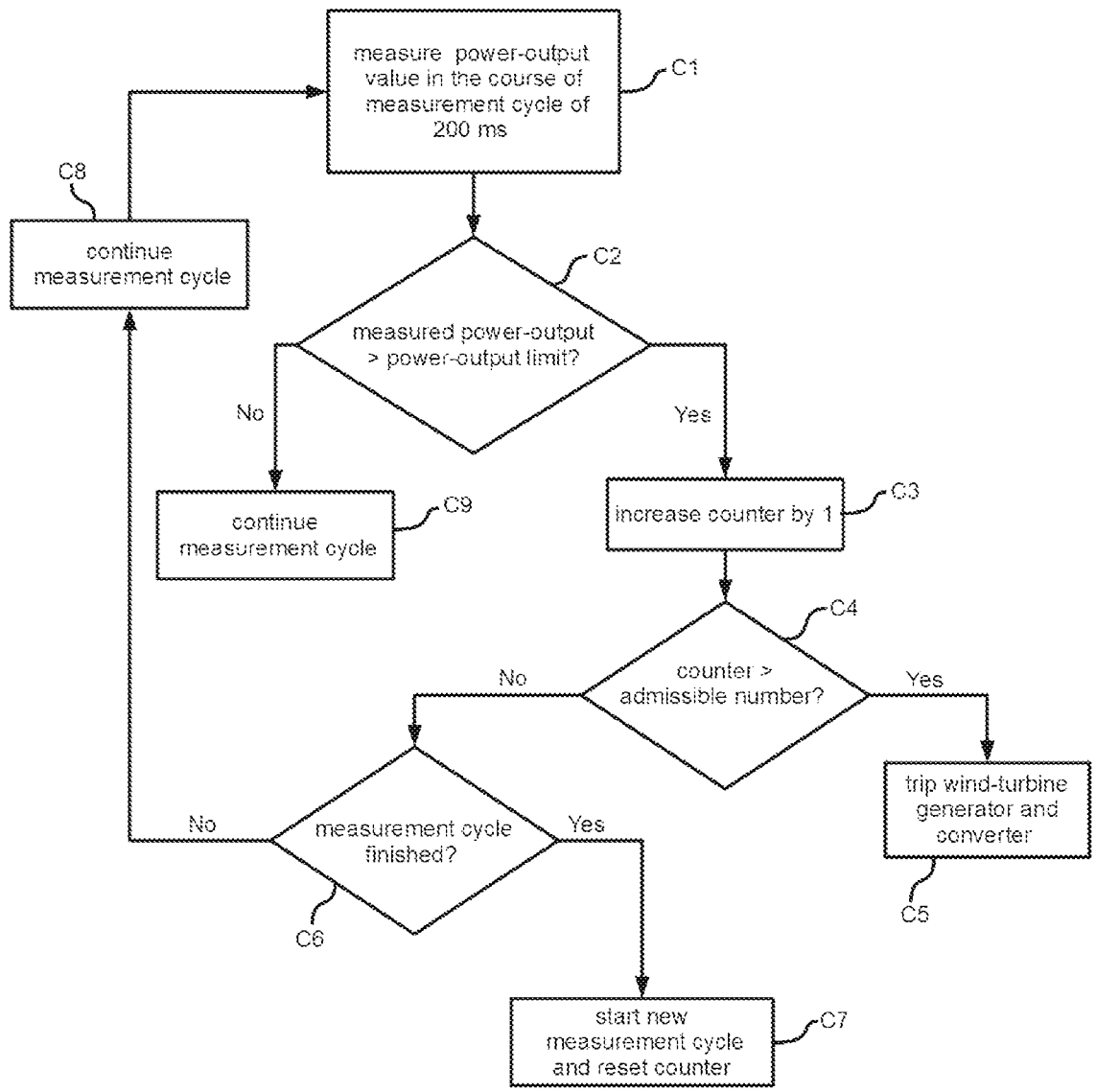
FIG. 10 is a schematic block-diagram illustrating an exemplary method of protecting the DFIG wind turbine against an SSR-event, with a counter value of power-output values that exceed a given threshold as the oscillation parameter.

A schematic block diagram of another exemplary method of protecting a wind turbine converter system against a sub-synchronous resonance event acting on the wind turbine converter system is given by FIG. 10. In activity C1 a power-output value is measured in the course of a current measurement cycle. The power-output of the wind turbine is measured by a power-output measurement device, shown in FIG. 2. The measured power-output value is compared with a power/current-output limit in activity C2. If the measured power-output value is greater than the power-output limit, a counter value is increased by one in activity C3.

Thereby a count of power-output values that exceed the given power-output limit is performed. The counter value serves as the oscillation-parameter indicative of the presence of an SSR-event critical for further operation of the wind turbine. If the measured power-output is below the power-output limit, the measurement cycle continues in activity C9.

The current value of the counter value is compared with a given admissible number of power-output values above the power-output limit in activity C4 that corresponds to the threshold to be exceeded by the value of the count to fulfill the at least one condition for determining the power-output values to be indicative of a critical SSR-event.

When the counter value exceeds that admissible number the wind turbine is shut down. If the counter is, however, below that admissible number, and the measurement cycle has not finished, the measurement cycle simply continues in activity C8 and is continued by measuring a new power-output value. Otherwise, when the measurement cycle has finished, a new measurement cycle is started and the counter value is reset, e.g. set to zero again in activity C7.

Figure 11:
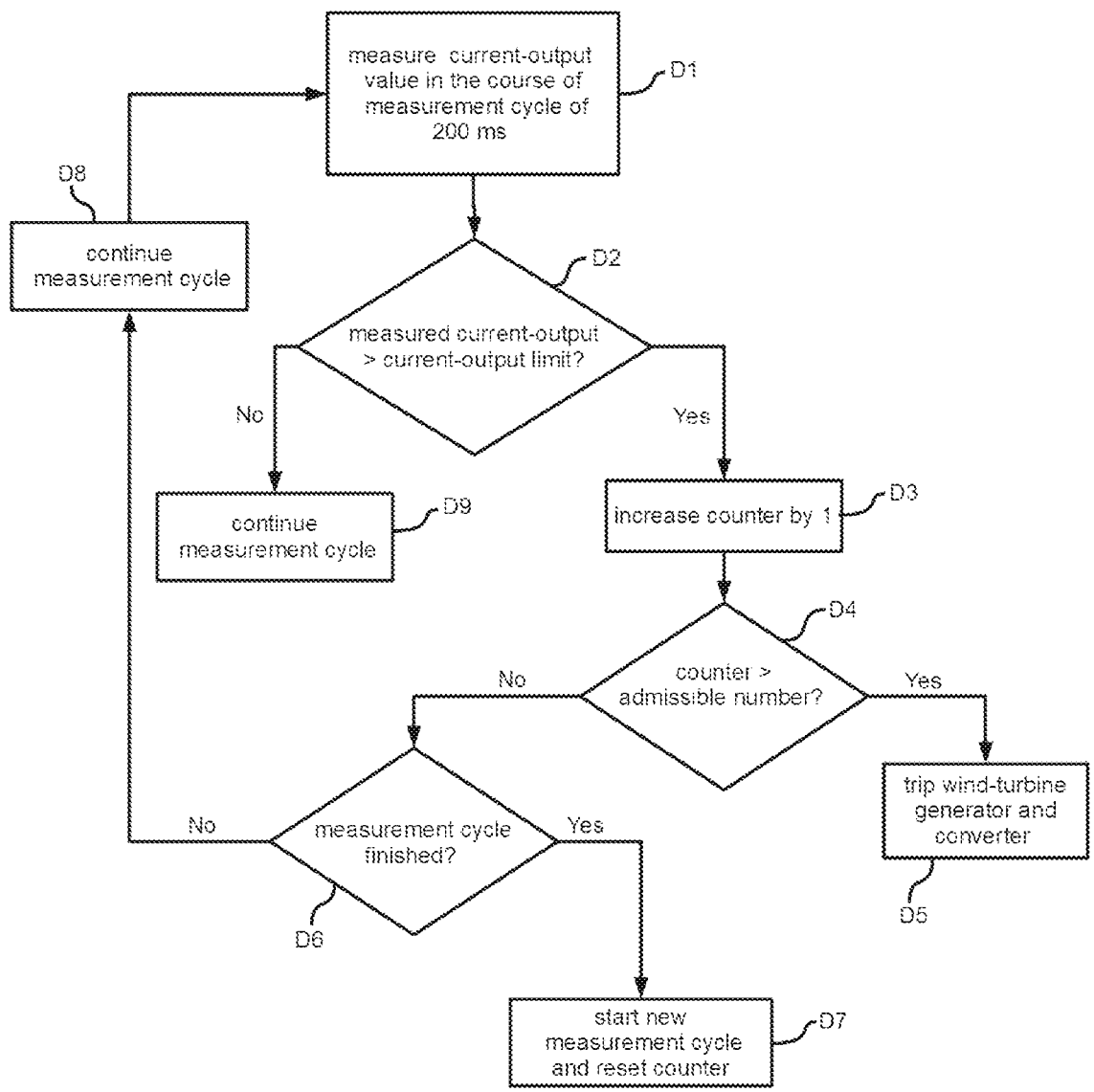
FIG. 11 is a schematic block-diagram an exemplary method of protecting the DFIG wind turbine against an SSR-event, with a counter value of current-output values that exceed a given threshold as the oscillation parameter.

A schematic block diagram of another exemplary method of protecting a wind turbine converter system against a sub-synchronous resonance event acting on the wind turbine is given by FIG. 11. This method corresponds to the method described in conjunction with FIG. 10, however with the only difference that a current-output values are measured in the course of a measurement cycle in activity D1 and compared with a current-output limit D2 instead of power-output values being compared with a power-output limit. When the measured current output exceeds the current-output limit a counter value is increased by 1 in activity D3. This counter value serves as the oscillation-parameter in the method described in conjunction with FIG. 11. The following activities D4 to D9 are analogous to the activities already described in conjunction with FIG. 10.

Although certain products constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

The invention claimed is:

1. A method of protecting a wind turbine with a doubly-fed induction generator (DFIG) against a sub-synchronous resonance (SSR) event, the method comprising:
measuring a plurality of output values of an output parameter of the wind turbine during a first measurement cycle;
monitoring an oscillation parameter obtained using the plurality of output values, wherein the oscillation parameter is based on a deviation value calculated based on an integration of differences between the output values and a reference output value, wherein the deviation value is stored when the deviation value exceeds a deviation threshold;

determining, based on comparing the oscillation parameter with a first threshold, whether the plurality of output values indicates a SSR event critical for further operation of the wind turbine; and shutting down the wind turbine when the oscillation parameter exceeds the first threshold for one or more measurement cycles.

2. The method of claim 1, wherein monitoring the oscillation parameter is triggered by an output value exceeding a second threshold.

3. The method of claim 1, wherein monitoring the oscillation parameter comprises:

calculating the oscillation parameter based on differences between (i) measured power output values or current output values of the first measurement cycle and (ii) a reference power output value or a reference current output value; and integrating the differences over time to obtain a power output deviation energy value or an integrated current output deviation value of the first measurement cycle, wherein the reference output value is the reference power output value or the reference current output value, and wherein the deviation value is the obtained power output deviation energy value or the integrated current output deviation value.

4. The method of claim 3, further comprising:

comparing the power output deviation energy value or the integrated current output deviation value with a first energy threshold or a first integrated current deviation threshold; and storing the power output deviation energy value or the integrated current output deviation value of the first measurement cycle when the power output deviation energy value or the integrated current output deviation value exceeds the respective first energy threshold or the first integrated current deviation threshold.

5. The method of claim 3, further comprising:

calculating an accumulated power output deviation energy value or an accumulated integrated current output deviation value using stored power output deviation energy values or stored integrated current output deviation values obtained over a number of successive measurement cycles, wherein the accumulated power output deviation energy value or the accumulated integrated current output deviation value corresponds to the oscillation parameter.

6. The method of claim 5, wherein calculating the accumulated power output deviation energy value or the accumulated integrated current output deviation value comprises:

adding up stored power output deviation energy values or stored integrated current output deviation values obtained over a number of measurement cycles.

7. The method of claim 6, further comprising:

refreshing the stored power output deviation energy values or the stored integrated current output deviation values when the number of measurement cycles pass without any of the plurality of power output deviation energy values or the plurality of integrated current output deviation values exceeding the first energy threshold or the first integrated current deviation threshold.

8. The method of claim 5, wherein the stored power output deviation energy values or the stored integrated current output deviation values are obtained over a number of preceding measurement cycles by:

storing power output deviation energy values exceeding a first energy threshold or storing integrated current output deviation values exceeding a first integrated current deviation threshold, wherein the accumulated power output deviation energy value or the accumulated integrated current output deviation value is calculated using the stored power output deviation energy values or the stored integrated current output deviation values.

9. The method of claim 5, further comprising:

comparing the accumulated power output deviation energy value or the accumulated integrated current output deviation value with a respective second energy threshold or a second integrated current output deviation threshold.

10. The method of claim 5, further comprising:

determining a trend of a plurality of power output deviation energy values or a plurality of integrated current output deviation values over a number of preceding measurement cycles.

11. The method of claim 10, wherein the plurality of output values indicates a SSR event critical for further operation of the wind turbine in response to (i) the accumulated power output deviation energy value exceeding a second energy threshold or the accumulated integrated current output deviation value exceeding a second integrated current output deviation threshold and (ii) the trend of the plurality of power output deviation energy values or the plurality of integrated current output deviation values being increasing over the number of preceding measurement cycles.

12. The method of claim 1, wherein the plurality of output values are one of power output values and current output values.

13. A method of protecting a wind turbine with a doubly-fed induction generator (DFIG) against a sub-synchronous resonance (SSR) event, the method comprising:

measuring a plurality of output values of an output parameter of the wind turbine during a first measurement cycle;

monitoring an oscillation parameter obtained using the plurality of output values, wherein the oscillation parameter is a counter value of output values that exceed a limit during a single measurement cycle;

determining, based on comparing the oscillation parameter with a first threshold, whether the plurality of output values indicates a SSR event critical for further operation of the wind turbine; and shutting down the wind turbine when the oscillation parameter exceeds the first threshold for one or more measurement cycles.

14. The method of claim 13, wherein the output values indicate a SSR event critical for further operation of the wind turbine, in response to the counter value exceeding a given output limit more than an admissible number during the single measurement cycle.

15. The method of claim 14, wherein the limit is one of: 125 percent of a nominal active power output of a converter system of the wind turbine, and 125 percent of a nominal current output of the converter system.

16. The method of claim 13, wherein the limit comprises one of a power output limit and a current output limit.

17. A wind turbine controller of a wind turbine with a doubly-fed induction generator (DFIG), the wind turbine controller being arranged to protect the wind turbine against a sub-synchronous resonance (SSR) event, the wind turbine controller configured to perform an operation comprising:
- receiving a plurality of output values of an output parameter of the wind turbine during a first measurement cycle;
- monitoring an oscillation parameter obtained using the plurality of output values, wherein the oscillation parameter is based on a deviation value calculated based on an integration of differences between the output values and a reference output value, wherein the deviation value is stored when the deviation value exceeds a deviation threshold;
- determining, based on comparing the oscillation parameter with a first threshold, whether the plurality of output values indicates a SSR event critical for further operation of the wind turbine; and
- shutting down the wind turbine when the oscillation parameter exceeds the first threshold for one or more measurement cycles.

18. The wind turbine controller of claim 17, wherein the plurality of output values comprises one of power output values and current output values.

19. The wind turbine controller of claim 17, wherein monitoring the oscillation parameter comprises:
- calculating the oscillation parameter based on differences between (i) measured power output values or current output values of the first measurement cycle and (ii) a reference power output value or a reference current output value; and
- integrating the differences over time to obtain a power output deviation energy value or an integrated current output deviation value of the first measurement cycle,
- wherein the reference output value is the reference power output value or the reference current output value, and
- wherein the deviation value is the obtained power output deviation energy value or the integrated current output deviation value.

20. The wind turbine controller of claim 19, wherein the plurality of output values indicates a SSR event critical for further operation of the wind turbine in response to (i) an accumulated power output deviation energy value exceeding a first energy threshold or an accumulated integrated current output deviation value exceeding a first integrated current output deviation threshold and (ii) a trend of the plurality of power output deviation energy values or the plurality of integrated current output deviation values being increasing over the number of preceding measurement cycles.

* * * * *